United States Patent [19]

Keller

[11] Patent Number: 4,638,314
[45] Date of Patent: Jan. 20, 1987

[54] METER TRANSPONDER HYBRID

[75] Inventor: Franz Keller, Boston, Mass.

[73] Assignee: American Science and Engineering, Inc., Cambridge, Mass.

[21] Appl. No.: 570,118

[22] Filed: Jan. 12, 1984

[51] Int. Cl.⁴ ............................................. G08C 9/06
[52] U.S. Cl. ........................ 340/870.02; 340/870.19
[58] Field of Search ............... 340/870.02, 870.01, 340/870.19; 179/2 AM; 324/142, 96; 361/399, 415

[56] References Cited

U.S. PATENT DOCUMENTS

| | | | |
|---|---|---|---|
| 3,170,150 | 2/1965 | Kelar et al. | 340/870.02 |
| 4,130,874 | 12/1978 | Pai | 364/514 |
| 4,281,325 | 7/1981 | Jarva | 340/870.02 |
| 4,350,980 | 10/1982 | Ward | 340/870.02 |
| 4,439,764 | 3/1984 | York et al. | 340/870.02 |

Primary Examiner—James L. Rowland
Assistant Examiner—T. Rittmaster
Attorney, Agent, or Firm—Pollock, VandeSande and Priddy

[57] ABSTRACT

A remotely-read energy metering product comprises a conventional watt-hour meter to which an electronics package has been added, the package comprising a thin, annular, printed circuit board mounted for support on an annular adaptor ring and disposed in surrounding relation to the annular watt-hour meter. Electrical components mounted on the printed circuit board provide an electronic read-out circuit for a pulse initiator, and further provide the transponder electronics for effecting bidirectional communication between the watt-hour meter and a remote location.

5 Claims, 3 Drawing Figures

METER TRANSPONDER HYBRID

BACKGROUND OF THE INVENTION

The present invention is concerned with a remotely-read energy metering product which is adapted to monitor energy usage and to process energy data for transmission to a remote location over AC power lines in a system of the type shown, for example, in Jagoda U.S. Pat. No. 4,012,734 issued Mar. 15, 1977, for "Synchronous Power Communicating". The device of the present invention is intended to be utilized by electric utilities to perform the functions of measuring the consumption of energy by individual customers of the utility, said measurement being performed at the customer's premises, and to read the measurement remotely by sending signals over the power lines as opposed to having an employee of the utility visit the customer and visually read a watt-hour meter.

Electrical utility companies bill their customers based on the total amount of energy used by the customer. This is ordinarily achieved by placing an energy recording device, i.e., a known form of watt-hour meter, at the customer's residence. Such watt-hour meters have a mechanical display which is read, usually monthly, by an employee of the utility; and the difference between successive month's readings represents the energy used by the customer during a given month, and is the basis for the customer's bill.

Watt-hour meters are commercially available in various constructions. Typically, such meters have sensors which are interconnected with the customer's electrical wiring in such a manner that they will detect both the voltage input to the customer by the utility and the current drawn by the customer. These sensors cause rotation of a metallic disc in the meter, and the angular rotation of the disc is a linear function of the energy, expressed in watt-hours, used by the customer. The angular rotation of the disc drives a series of reduction gears which, in turn, cause the incrementing of a numerical display register.

In recent years, electrical utilities have expressed an increasing interest in metering plans which are more complicated than just metering the total energy used. One approach is to bill the customer at a varying rate for the energy depending upon the time of day the energy is used. Another approach is to use a charge for the speed at which energy is used, called the "demand". The motivation for these alternative approaches is the increased cost associated with generating electricity, and utilities are interested in billing approaches which more accurately reflect the cost of generating electricity. Additionally, many utilities seek to use their billing mechanism as a motivational tool to encourage customer's to change their usage habits in a manner which will make the overall generation of electricity less expensive, i.e., they seek to encourage people, via financial incentives or penalties, to activate "optional" loads at "off-peak" hours.

American Science and Engineering, Inc., of Cambridge, Mass., the assignee of the instant application, manufactures a product line which enables utilities to perform these advanced metering techniques. The operation of this system is generally described in the aforementioned Jagoda et al U.S. Pat. No. 4,012,734, and the system provides the very desirable capability of collecting metering information at a central location by sending signals over the power lines. Signal transmission is in two directions, i.e., an outbound message from the central location causes equipment at the customer's location to generate an inbound message to the central location containing the metering information.

The aforementioned known system utilizes the watt-hour meter as the principal sensor of electrical energy consumption. A device is affixed to the watt-hour meter to generate output signals indicating revolution of the meter disc. Such devices, commonly referred to as pulse initiators, are in themselves well known and may take the form, for example, which is described in Jarva U.S. Pat. No. 4,281,325 issued July 28, 1981, for "Positive Feedback Meter Pulse Initiator". Pulse initiators are commercially available and adapted to be affixed to an existing watt-hour meter or, alternatively, some meter manufacturers offer watt-hour meters with the pulse initiator already built in.

The metering information supplied by a meter/pulse initiator device of one of the types described above can be transferred to a remote location, in response to a command from that remote location, by means of a so-called transponder which is adapted to count pulses thereby to provide the desired metering information, and to perform the function of reading the metering information over the power line. One approach that was originally taken was to supply such a transponder in the form of a separate piece of hardware having male connectors on one side thereof adapted to be plugged into the socket which customarily receives the watt-hour meter, in place of the watt-hour meter itself, the transponder also being provided with an auxiliary set of female connectors into which the male contacts of the meter are plugged, as well as a further connector into which the pulse initiator output lead of the meter can be plugged. This plural pluggable unit arrangement made it generally difficult, however, and often hazardous, to install a meter and an associated transponder and, moreover, required that an objectionably large number of interconnections be made.

In order to obviate the foregoing disadvantages, an alternative unit was disclosed in prior copending Kochem et al U.S. application Ser. No. 279,409 filed July 1, 1981, for "Meter Transponder Hybrid", assigned to the assignee of the present invention, now abandoned. In the Kochem et al arrangement, a single unit was provided which combined the functions of the watt-hour meter, pulse initiator, and transponder, with this single unit taking the form of an integrated structure that is as easy and safe to install as the conventional watt-hour meter. The Kochem et al meter transponder hybrid suffered from the disadvantages, however, that it required fairly extensive modification of the mechanical portions of a commercially available watt-hour meter mechanism, thereby making the meter conversion time consuming and very costly; the overall profile of the modified meter unit was significantly larger than that of a conventionally available watt-hour meter; and the modification of the meter to accept the transponder involved an enlargement of the four blades of the meter, which enlargement caused the conventional current capacity of the watt-hour meter (normally 200 amps) to be derated somewhat.

The present invention provides an improved meter transponder hybrid which exhibits the advantages of the aforementioned Kochem et al unit, but which avoids the disadvantages thereof, i.e., the unit of the present invention exhibits a low overall profile, with no extended blades, and hence has negligible impact on 200 ampere service; there are no alignment problems between the transponder and the meter; no hole is required in the meter base for the pulse initiator wiring; and the overall unit is less expensive to manufacture since it employs an entirely conventional, commercially available watt-hour meter which is used in its unmodified form (except for the addition of the optical head of a pulse initiator, if such a pulse initiator is not already present on the meter). The invention, in effect, provides an electronics package that contains the pulse initiator readout circuit and the transponder electronics in a physical arrangement which is added to the conventional watt-hour meter without requiring any physical change to the meter movement itself and without increasing the overall profile of the meter.

SUMMARY OF THE INVENTION

The foregoing objects and advantages of the present invention are achieved by supplementing a conventional watt-hour meter with a concentric array of transponder electronics, i.e., an annular electronics package consisting of a printed circuit board and attached electrical components whose overall configuration is generally cylindrical and sized to slip over the exterior of a commercially available watt-hour meter mechanism in surrounding relation thereto.

More particularly, a double-sided printed circuit board with plated through holes which also carries the electronics components is provided in a thickness which is much thinner than that conventionally provided in printed circuit boards. The thin, and accordingly flexible, printed circuit board can be bent to be mounted on the inside diameter of a comparatively rigid adaptor ring. After the cover of the meter is removed, the adaptor ring with the attached electronics slides over the meter mechanism, power and optical head connections are made via connectors, and the meter cover is then slid over the watt-hour meter mechanism, together with the annular package of transponder electronics surrounding said mechanism, and is locked into its hold down position. The meter concentric mounted transponder electronics can now be connected like any conventional meter to a ring or ringless meter socket, and employed in a system of the type described in the aforementioned Jagoda patent to count pulses that are being generated by the pulse initiator portion of the annular supplemental package and, in response to an activating signal received by the transponder portion of the package over the power lines, to transmit metering information over the power lines from the meter to a remote location.

BRIEF DESCRIPTION OF THE DRAWINGS

The foregoing objects, advantages, construction and operation of the present invention will become more readily apparent from the following description and accompanying drawings wherein.

DESCRIPTION OF THE PREFERRED EMBODIMENTS

Figure 1:
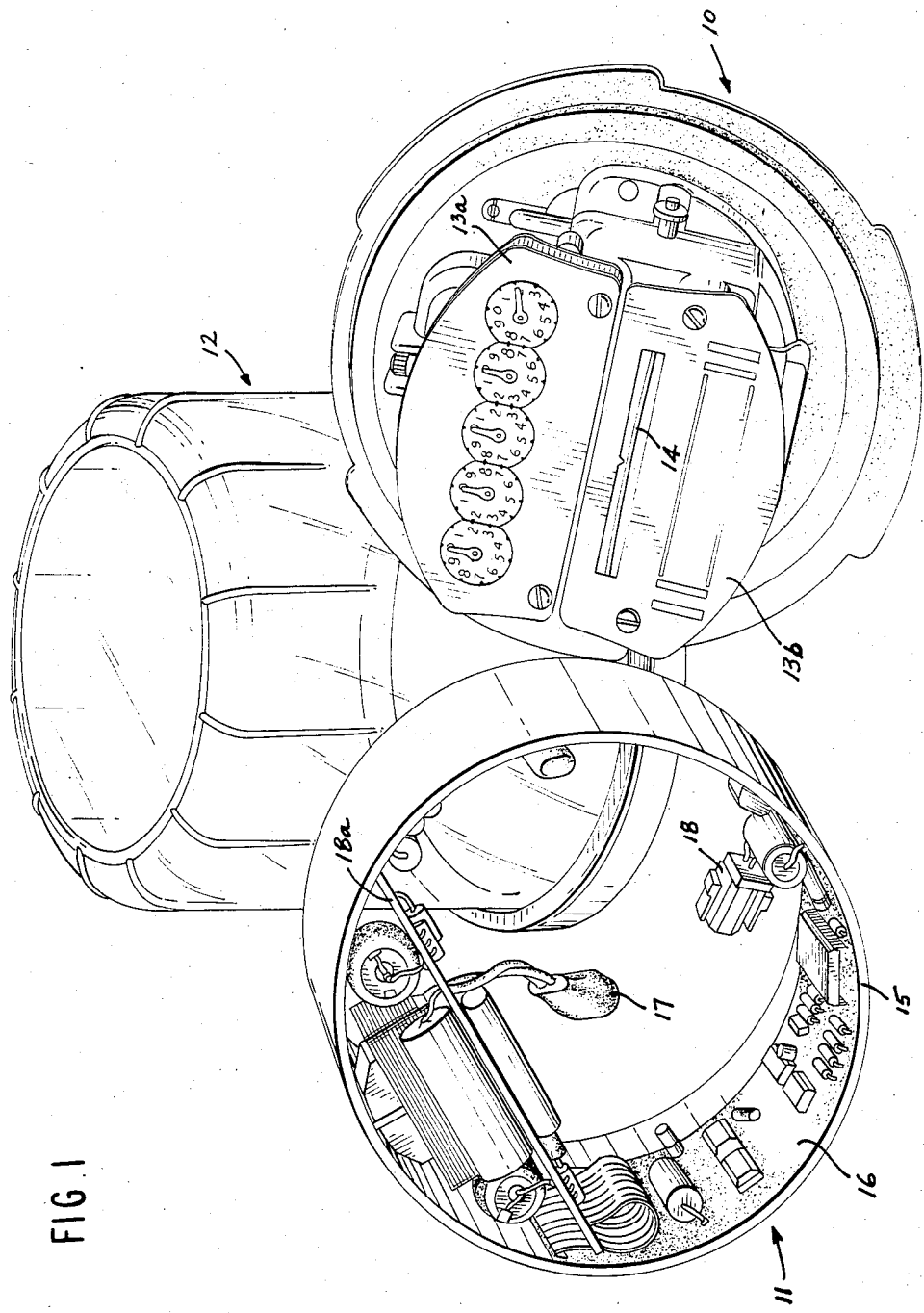
FIG. 1 is a perspective illustration of one embodiment of the present invention in its disassembled state.

As indicated previously, the improved meter transponder hybrid of the present invention is a device that employs a conventional watt-hour meter mechanism to monitor energy usage, together with electronic circuitry to perform processing of the energy data. Further electronics allows the data to be read from a remote location by means of signals sent over the AC power lines. One embodiment of the invention is shown in FIG. 1 (in its disassembled state) and FIG. 2 (in its assembled state). It comprises a watt-hour meter mechanism 10, an electronics package 11 which is added to the mechanism 10, and a unitary cover 12 which is adapted to overlie units 10 and 11 after the electronics package has been disposed concentrically about meter mechanism 10 and electrically connected thereto.

The meter mechanism 10 is in itself a conventional, commercially available watt-hour meter of the type which is manufactured and sold by various companies in the United States e.g., Westinghouse, General Electric, etc. The meter mechanism 10 includes a face plate one portion 13a of which supports a numerical display register, and another portion 13b of which includes an elongated aperture through which a portion of a rotatable metallic disc 14 protrudes. The meter mechanism is, in well known fashion, adapted to be connected to power lines at a customer's location and, as power is consumed by the customer, the disc 14 rotates at a rate related to the rate of power consumption, with the number of revolutions of the disc 14 being registered, through appropriate intervening gearing, on the said display register. The present invention makes use of the watt-hour meter 10 in the form in which it is commercially available, and without modification except that the optical head of a pulse initiator of the type shown in Jarva U.S. Pat. No. 4,281,325 is mounted on the interior side of the face plate portion 13b in a position to embrace rotating disc 14. There is ample room for the mounting of such an optical head in a commercially available watt-hour meter and, when mounted, the optical head provides a train of output pulses whose number and rate of occurrence is determined by the amount and speed of rotation of meter disc 14.

Electronics package 11 includes, inter alia, a read-out circuit which is adapted to be connected to the output of the aforementioned pulse initiator optical head, either by hard wire connection or by a separable electrical connector unit, for purposes of counting the pulses that are generated by the pulse initiator thereby to provide metering information. The electronics package 11 further includes electronic circuits for receiving signals from a remote location over the power lines to which the overall meter transponder hybrid is connected and, in response to said received signals, for transmitting over said power lines to the remote location information derived from the pulse initiator read-out circuit indicative of the energy consumption by a given consumer. In accomplishing these purposes, electronics package 11 consists of a comparatively rigid adaptor ring 15 taking the form of a hollow plastic cylinder or annulus whose diameter is slightly larger than the diameter of the meter mechanism 10, a double-sided printed circuit board 16 with plated through holes which carries and interconnects the electronic components which form the aforementioned pulse initiator read-out circuit and transponder circuit, and a pair of interface connectors 17 and 18 ore of which, 17, is separably connected to the 220 volt power interface coming into the meter mechanism 10 after the electronics package 11 has been placed concentrically about meter mechanism 10, and the other of which, 18, is adapted to be separably connected to the output of the aforementioned pulse initiator optical head. Connector 18 is optional and, if desired, may be replaced by a hard wire connection between the output of the optical head on the meter mechanism portion of the unit and the readout circuit on the electronics package 11.

Printed circuit board 16 is very thin, and accordingly quite flexible, i.e. instead of having the thickness conventionally associated with printed circuit boards (0.0625 inches) it is only 0.01 inches thick. This extremely thin printed circuit board can bend to be mounted along the inside diameter (5.5 inches) of the adaptor ring 15. The height of the adaptor ring 15 in a direction parallel to the central axis of the meter mechanism 10 is greater than the width in that direction of the printed circuit board 16, i.e. the height of the adaptor ring is 5 inches, whereas the corresponding height (i.e. width) of printed circuit board 16 is 4 inches. The printed circuit board is mounted for support on adaptor ring 15, with the forwardmost edge of the printed circuit board being closely adjacent to the forwardmost edge of the adaptor ring 15; and, to provide room for additional components forming portions of the aforementioned circuits, a comparatively rigid circuit board 18a, e.g., having the aforementioned conventional thickness, can be mounted across a portion of the interior of cylindrical adaptor ring 15 in the chord-like fashion illustrated in FIG. 1, with the additional electrical components being supported on opposing sides of board 18a in the fashion illustrated. The width of board 18a is such that, when electronics package 11 is mounted in place in surrounding relation to meter mechanism 10, board 18a and the components thereon are disposed forward of faceplate portion 13a at a position above the numerical display register of the meter (see FIG. 2).

Figure 2:
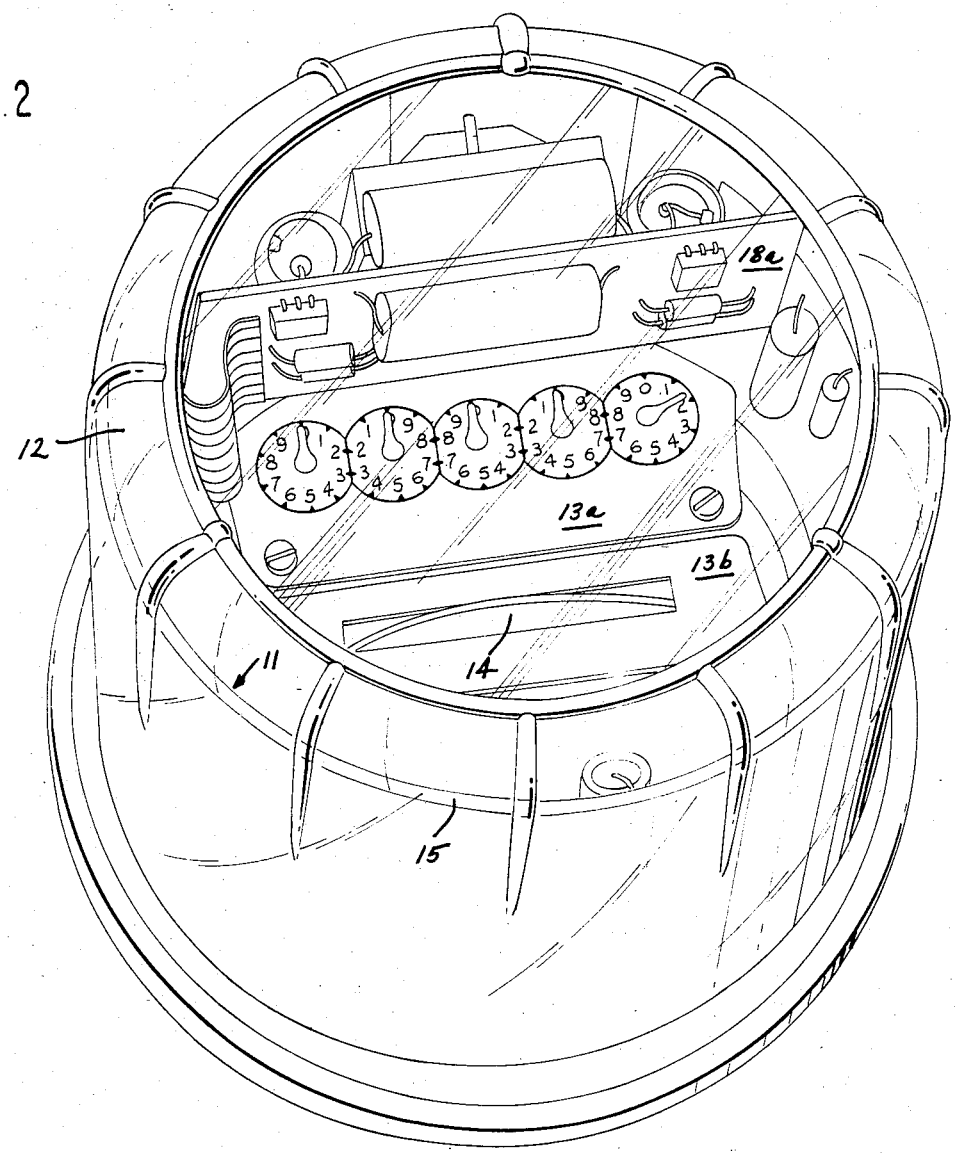
FIG. 2 depicts the structure of FIG. 1 in its assembled state.

To effect the assembly shown in FIG. 2, the cover 12 of the meter is removed, the adaptor ring 15 with the attached electronics is then slid over the meter in concentric relation thereto, the electronics package 11 is electrically connected to the power lines via connector 17, and the electronic circuits are also connected to the pulse initiator optical head by means of connector 18. After the connections have been made, the meter cover 12 is slid over the meter mechanism and associated electronic package, and locked into the hold-down position as shown in FIG. 2. The meter concentric mounted transponder electronics can now be connected like any conventional meter to a ring or ringless meter socket.

The size of the meter cover 12 is dictated by the size of the added electronics package 11. If the size of the package 11 is small enough, the meter cover which is normally supplied by a watt-hour meter manufacturer as part of the commercially available meter, can be used. In units which have been constructed by the inventor herein, however, the height of the electronics package 11, when installed, was slightly greater than could be accommodated by the standard profile cover usually provided with watt-hour meters. Higher covers are, however, available commercially from the same manufacturer, i.e., they are used for other types of meter, and these other covers have the same base dimensions as the watt-hour meter itself. The cover 12 depicted in FIGS. 1 and 2 is one of these other, commercially available, slightly higher covers.

Figure 3:
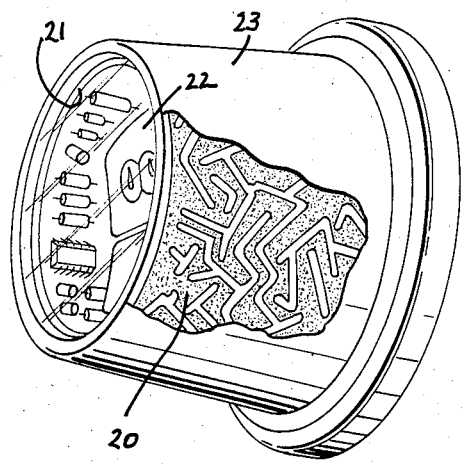
FIG. 3 is an illustrative perspective view, partially in section, showing a modified form of the present invention.

In the embodiment of the invention shown in FIGS. 1 and 2, the thin flexible circuit board 16 does not extend completely through 360° inasmuch as board 18a has been added to support certain of the components of the electronic circuits. In an alternative arrangement shown in FIG. 3, a slightly different arrangement is used, i.e., the concentric printed circuit 20 mounted on the interior of its associated adaptor ring 21 extends through substantially 360° on the adaptor ring, no auxiliary support structure (such as 18a) is provided, and the concentric mounted circuit electronics are disposed in an array which is closely adjacent to, and for the most part forward of, the watt-hour meter face 22. As before, the assembled meter/electronics unit is covered by a meter cover 23.

Having thus described my invention, I claim:

1. In an energy consumption measuring system of the type comprising a standard watt-hour meter consisting of a meter movement mounted within a standard enclosing cover, said meter movement being connected to power lines and having a metallic disc mounted for rotation at a rate related to the consumption by a consumer of energy supplied over the said power lines, a pulse initiator located within said standard meter cover and responsive to rotation of said disc for generating pulses indicative of the said energy consumption, and a transponder for effecting two-way communication between said watt-hour meter and a remote central location, said transponder including means for receiving signals transmitted from a remote central location over said power lines and means for transmitting metering information to said remote central location over said power lines, said transponder further including means responsive to said pulses generated by said pulse initiator for providing the metering information that is to be transmitted over said power lines upon receipt of a signal over said power lines from the remote central location, the improvement wherein said transponder comprises a circuit board of substantially annular configuration which is disposed externally of and in at least partially surrounding relation to said standard watt-hour meter movement within said standard cover of said meter, said transponder comprising a plurality of electrical components which are mounted on said annular circuit board in spaced relation to one another adjacent the exterior of the meter movement and within said standard meter cover, coupling means for connecting selected ones of said transponder electrical components to said pulse initiator, and further coupling means for connecting other selected ones of said transponder electrical components to said power lines, said transponder and each of said coupling means being located entirely within said standard cover.

2. The structure of claim 1 wherein said annular circuit board comprises a thin, flexible printed circuit board which is mounted for support on the interior surface of a comparatively rigid cylindrical support ring.

3. The structure of claim 1 wherein at least one of said coupling means comprises a separable electrical connector.

4. The structure of claim 1 wherein all of said electrical components are mounted on said circuit board in an annular array of components that is disposed in surrounding relation to said meter movement.

5. The structure of claim 4 wherein said meter includes a face plate, at least some of the components in said annular array being positioned forward of said meter face plate.

* * * * *